US008775927B2

(12) United States Patent
Dirstine

(10) Patent No.: US 8,775,927 B2
(45) Date of Patent: *Jul. 8, 2014

(54) METHOD FOR COMPRESSING XML DOCUMENTS INTO VALID XML DOCUMENTS

(75) Inventor: Adam D. Dirstine, Rochester, MN (US)

(73) Assignee: Digi International Inc., Minnetonka, MN (US)

( * ) Notice: Subject to any disclaimer, the term of this patent is extended or adjusted under 35 U.S.C. 154(b) by 1987 days.

This patent is subject to a terminal disclaimer.

(21) Appl. No.: 11/980,901

(22) Filed: Oct. 31, 2007

(65) Prior Publication Data

US 2008/0065785 A1 Mar. 13, 2008

Related U.S. Application Data

(62) Division of application No. 10/710,835, filed on Aug. 5, 2004.

(51) Int. Cl.
*G06F 17/00* (2006.01)

(52) U.S. Cl.
USPC ............ 715/242; 715/234; 715/237; 715/239

(58) Field of Classification Search
USPC .................. 715/234, 237, 239, 254, 200, 242
See application file for complete search history.

(56) References Cited

U.S. PATENT DOCUMENTS

| 6,189,097 | B1 * | 2/2001 | Tycksen et al. ............... 713/156 |
| 6,635,088 | B1 | 10/2003 | Hind et al. |
| 6,711,740 | B1 | 3/2004 | Moon et al. |
| 6,850,948 | B1 * | 2/2005 | Krasinski .............................. 1/1 |
| 6,879,988 | B2 | 4/2005 | Basin et al. |
| 7,007,105 | B1 | 2/2006 | Sullivan |
| 7,016,962 | B2 | 3/2006 | Hertling et al. |
| 7,178,163 | B2 * | 2/2007 | Reeves, Jr. ........................ 726/2 |
| 7,348,904 | B2 * | 3/2008 | Christoffersson et al. ..... 341/106 |
| 7,617,447 | B1 | 11/2009 | Jones et al. |
| 2001/0047365 | A1 | 11/2001 | Yonaitis |
| 2002/0107887 | A1 | 8/2002 | Cousins |
| 2003/0005001 | A1 | 1/2003 | Kataoka |
| 2003/0018466 | A1 | 1/2003 | Imaura |
| 2003/0023628 | A1 | 1/2003 | Girardot et al. |
| 2003/0046317 | A1 * | 3/2003 | Cseri et al. .................... 707/513 |
| 2003/0159136 | A1 | 8/2003 | Huang et al. |
| 2003/0226066 | A1 * | 12/2003 | Weddle et al. .................. 714/43 |
| 2004/0133855 | A1 | 7/2004 | Blair et al. |
| 2004/0143791 | A1 | 7/2004 | Ito et al. |

(Continued)

FOREIGN PATENT DOCUMENTS

| WO | WO-2006017804 A2 | 2/2006 |
| WO | WO-2006017804 A3 | 2/2006 |

OTHER PUBLICATIONS

"U.S. Appl. No. 10/710,835, Advisory Action mailed Jul. 8, 2010", 3 pgs.

(Continued)

*Primary Examiner* — Thu Huynh
(74) *Attorney, Agent, or Firm* — Fogg & Powers LLC

(57) ABSTRACT

A method comprising compressing a first XML document into a binary stream, converting the binary stream into a compressed valid XML document, and associating at least one XML tag with the compressed valid XML document in order to identify the document as a compressed XML document.

18 Claims, 6 Drawing Sheets

(56) References Cited

U.S. PATENT DOCUMENTS

| | | | |
|---|---|---|---|
| 2004/0205158 A1 | 10/2004 | Hsu | |
| 2005/0060372 A1* | 3/2005 | DeBettencourt et al. | 709/206 |
| 2005/0063575 A1* | 3/2005 | Ma et al. | 382/128 |
| 2005/0097503 A1 | 5/2005 | Zintel et al. | |
| 2005/0129033 A1* | 6/2005 | Gordy et al. | 370/401 |
| 2005/0138545 A1 | 6/2005 | Saint-Hilaire et al. | |
| 2005/0144556 A1 | 6/2005 | Petersen et al. | |
| 2005/0278616 A1 | 12/2005 | Eller | |
| 2006/0031756 A1 | 2/2006 | Dirstine | |
| 2008/0065785 A1* | 3/2008 | Dirstine | 709/247 |

OTHER PUBLICATIONS

"U.S. Appl. No. 10/710,835, Final Office Action mailed Apr. 15, 2010", 15 pgs.

"U.S. Appl. No. 10/710,835, Response filed Jun. 11, 2010 to Final Office Action mailed Apr. 15, 2010", 11 pgs.

"U.S. Appl. No. 10/710,835, Response filed Dec. 14, 2009 to Non Final Office Action mailed Aug. 21, 2009", 15 pgs.

"European Application Serial No. 05779691.4, Communication mailed Jul. 29, 2010", 4 pgs.

"European Application Serial No. 05779691.4, Response filed Jan. 4, 2010 to Communication dated Oct. 7, 2009", 13 pgs.

"International Application Serial No. PCT/US2005/028051, Written Opinion dated Feb. 14, 2006", 5 pgs.

"U.S. Appl. No. 10/710,835 , Non-Final Office Action mailed Aug. 21, 2009", 16 Pgs.

"U.S. Appl. No. 10/710,835, Advisory Action mailed Dec. 11, 2007", 4 pgs.

"U.S. Appl. No. 10/710,835, Appeal Brief mailed Feb. 1, 2008", 22 pgs.

"U.S. Appl. No. 10/710,835, Final Office Action mailed Mar. 23, 2009", 13 pgs.

"U.S. Appl. No. 10/710,835, Non Final Office Action mailed Apr. 17, 2007", 21 pgs.

"U.S. Appl. No. 10/710,835, Non-Final Office Action mailed May 28, 2008", 14 pgs.

"U.S. Appl. No. 10/710,835, Response filed Jun. 23, 2009 to Final Office Action mailed Mar. 23, 2009", 10 pgs.

"U.S. Appl. No. 10/710,835, Response filed Nov. 16, 2007 to Final Office Action mailed Sep. 19, 2007", 13 pgs.

"U.S. Appl. No. 10/710,835, Response filed Mar. 5, 2007 to Restriction Requirement mailed Jan. 5, 2007", 6 pgs.

"U.S. Appl. No. 10/710,835, Response filed Jun. 28, 2007 to Non Final Office Action mailed Apr. 17, 2007", 13 pgs.

"U.S. Appl. No. 10/710,835, Response filed Sep. 17, 2008 to Non Final Office Action mailed May 28, 2008", 10 pgs.

"U.S. Appl. No. 10/710,835, Restriction Requirement mailed Jan. 5, 2007", 5 pgs.

"European Application No. 05779691.4, Office Action mailed Oct. 7, 2009", 4 pgs.

"U.S. Appl. No. 10/710,835 Final Office Action mailed Sep. 19, 2007", 13 pgs.

"International Search Report for corresponding PCT Application No. PCT/US2005/028051", (Dec. 19, 2005),5 pgs.

"WAP Binary XML Content Format", Document ID WAP-192-WBXML-200515 Version 1.3, XP002168490,(May 15, 2000),1-25.

Grainger, B. , "'xls! Round trip: binary->XML->binary", http://www.xslt.com/html/xsl-list/2002-06/msg01242.html, XP002351320,(Jun. 24, 2002),1.

Isenburg, M. , et al., "Binary Compression Rates for ASCII Formats", *3D Technologies for the World Wide Web, Proceedings of the 8th International Conference on 3D Web Technology*, http://www.cs.unc.edu/isenburg/ac,(2003),173-178, 209.

Ishikawa, H. , et al., "Project Xanadu: XML- and Active-Database-Unified Approach to Distributed E-Commerce", *Database and Expert Systems Applications, 2001, Proceedings, 12th International Workshop, IEEE*, XP010558837,(Sep. 3, 2001),833-837.

Liefke, H. , et al., "XMiLL: An Efficient Compressor for XML Data", *Sigmond Record*, 29(2), (Jun. 2000), 153-164.

McArthur, G. , et al., "An Extensible Tool for Source Code Representation Using XML", *Reverse Engineering, Proceedings of Ninth Working Conference*, IEEE Compute Society,(Oct. 29, 2002),199-208.

Tolani, P. M., et al., "XGRIND: A Query-friendly XML Compressor", *Proceedings of the 18th International conference on Data Engineering, 18*, Author: haritsa@dsl.serc.iisc.ernet.in,(Feb. 26, 2002),225-234.

"U.S. Appl. No. 10/710,835, Non Final Office Action mailed Nov. 26, 2010", 24 pgs.

"U.S. Appl. No. 10/710,835, Response filed Mar. 8, 2011 to Non Final Office Action mailed Nov. 26, 2010", 7 pgs.

"European Application No. 05779691.4, Office Action Response Filed: Dec. 3, 2010", 14 pgs.

U.S. Patent and Trademark Office, "Notice of Allowance", from U.S. Appl. No. 10/710,835, Feb. 20, 2014, pp. 1-9, Published in: US.

European Patent Office, "Office Action from EP Application No. 05779691.4 mailed Apr. 17, 2014", "from Foreign Counterpart of U.S. Appl. No. 10/710,835", Apr. 17, 2014, pp. 1-6, Published in: EP.

* cited by examiner

```
<document type, format ="compression format">
    (compressed document inserted here)
</document type>
```

FIG. 6

```
<rci_reply version="1.0">
  <query_setting>
    <boot>
      <dhcp>off</dhcp>
      <ip>10.20.1.22</ip>
      <subnet>255.255.255.0</subnet>
      <gateway>10.20.1.1</gateway>
    </boot>
    <serial>
      <baud>9600</baud>
      <databits>8</databits>
      <stopbits>1</stopbits>
      <parity>none</parity>
      <flowcontrol>software</flowcontrol>
      <desc></desc>
    </serial>
  </query_setting>
</rci_reply>
```

FIG. 7

```
<rci_reply version="2.0" format="db64">
UEsDBBQAAAAIAHFS6DBCTIqX1wAAALkBAAAIAAAAb3JpZy54bWxdUVG
KwyAQ/S/sHXICNYGWXZidqxSTTrpCcKxOGnKPHrg2JCYsIr73Zpx5oxA7d40
Uhr16UkyO/e+rVuaFX6eqgsdIcb4mEnH+vkhZbJllxZnd/rqA3PegF1R0F7A2qjGq
Vk0D2h1CaWw9CTbns9q2Ab2qJetuhSY7lyo16E1ajeiDE0gUnR32660db/hzMbny
AnfDVmzrJOF3trzh3ZtwWJTcruASDTY6mdGzJ9ArKcF+4KljL5ETHNzLZGPO
Oqq7b0od5vafYxvmMADo/w8PuvxTZp/1BlBLAQIVCxQAAAAIAHFS6DBCTIqX
1wAAALkBAAAIAAAAAAAAAAEAIAC2gQAAAABvcmlnLnhtbFBLBQYAAAA
AAQABADYAAAD9AAAAAAA=
</rci_reply>
```

FIG. 8

METHOD FOR COMPRESSING XML DOCUMENTS INTO VALID XML DOCUMENTS

RELATED APPLICATION

This application is a divisional under 37 C.F.R. 1.53(b) of U.S. patent application Ser. No. 10/710,835 filed Aug. 5, 2004, which is incorporated herein by reference and made a part hereof.

TECHNICAL FIELD

This document relates generally to compression algorithms for data files and in particular to compressing extensible markup language (XML) documents.

BACKGROUND

The extensible markup language (XML) is a language that is written in the standardized general markup language (SGML). SGML is an international standard meta-language for text markup applications (ISO 8879). XML is a human-readable, text-based language making it easy to use. Partly because XML is written in an international standard and partly because of its ease of use, XML is widely used in a variety of applications. Another advantage is that XML files or documents explicitly flag the type of data contained in the documents by enclosing blocks of data with labels to declare the type of XML elements contained in a block. This makes XML documents data-type aware.

However, because it is human-readable and because it is data-type aware, XML can be a verbose language. Human-readable data files are larger compared to other formats (such as binary formats for example) and the data-type declarations expand the size of data files. Large XML files may cause problems in systems that are memory constrained or in communication systems having channels that are bandwidth limited.

SUMMARY

This document describes both devices and methods used to manage extensible markup language (XML) files or documents. One method example comprises compressing a first XML document into a binary stream, converting the binary stream into a compressed valid XML document, and associating at least one XML tag with the compressed valid XML document in order to identify the document as a compressed XML document.

One device example includes at least one processor, a network interface to communicate with the at least one processor and a network, and an XML document processing module. The XML document processing module includes a compression module to compress XML documents into compressed valid XML documents.

BRIEF DESCRIPTION OF THE DRAWINGS

FIG. 6 is an embodiment using an XML tag at the beginning and end of the file.

FIG. 7 is an original XML document configuration file.

FIG. 8 is the compressed version of the document.

DETAILED DESCRIPTION

In the following detailed description, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

This document discusses, among other things, methods and devices for managing extensible markup language (XML) files or documents. Because XML is widely used, many applications that use XML would benefit from reducing the size of XML documents. This is especially true where the applications are memory constrained such as in embedded systems. Application files that are reduced in size would allow the files to be stored using less memory. Applications that include bandwidth limited communication systems would also benefit from reducing the size of XML files. These applications include those that are slow, such as a slow serial line, or those that experience a large amount of communication traffic such as a wide area network (WAN). These applications would benefit from minimizing traffic by minimizing the amount of data transferred.

To manage the size of large XML documents, the documents are compressed. In contrast to typical compression methods however, documents compressed under the methods of the present application remain valid XML documents. A valid XML document is a document that is well formed and has an associated document-type declaration. This allows the compressed valid XML document to be recognized and accessed by applications that process XML documents.

Figure 1:
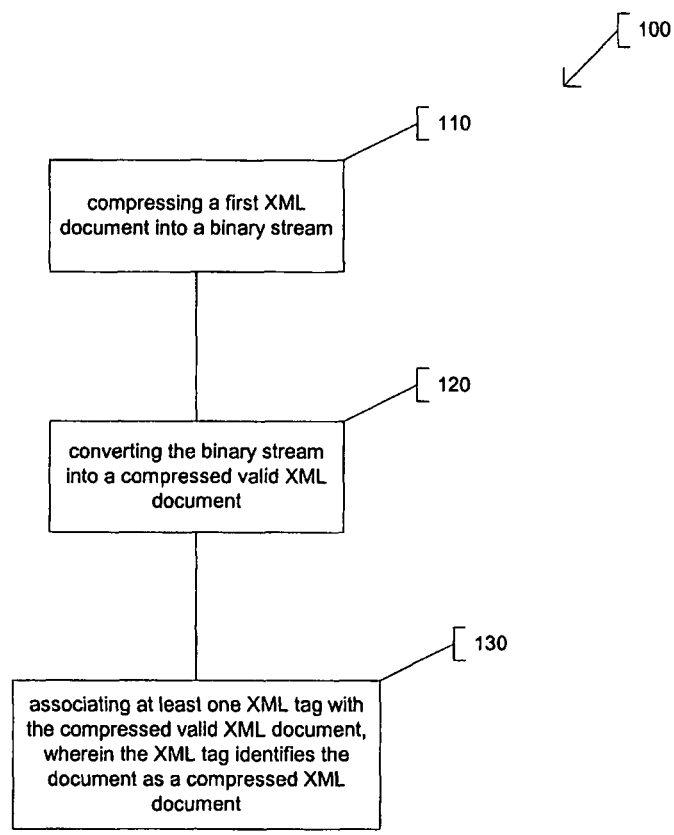
FIG. 1 shows a block diagram of one embodiment of a method of managing XML documents.

FIG. 1 shows a block diagram 100 of one embodiment of a method of managing XML documents. The method includes reducing the size of the document by compressing it. At 110, an XML document is compressed into a binary stream. Because XML documents are plain text, they are very redundant. Any compression method that results in good compression ratios on redundant text streams may be used. A 70% compression ratio is a typical good compression ratio. In one embodiment, the compression method is a deflate compression algorithm, such as RFC 1951 for example.

At 120, the binary stream is converted into a compressed valid XML document. To accomplish this, the binary stream is expanded back into text. This is necessary because valid XML documents cannot contain binary data. Preferably, the binary stream is expanded using base-64 encoding, but any encoding mechanism that has characteristics similar to base-64 encoding may be used. A mechanism with similar characteristics refers to an encoding mechanism that takes binary bytes of data and converts them into printable characters in the American Standard Code for Information Interchange (ASCII) standard. For example, UUencode has similar characteristics.

If base-64 encoding is not used, the resulting text must be searched through after encoding. Any characters that are present in the text that would cause the resulting document to be invalid XML must be converted. For example, use of the '<' or '>' characters would result in an invalid XML document, and the characters must be replaced with the standard XML replacement text '<' and '>', respectively. Base-64 does not require this replacement step because the resulting characters only consist of upper and lower case A-Z, numerals 0-9, '+', '/', and '=' which are valid XML characters. The result of using binary to ASCII encoding is an expansion of the binary stream back into a text file with an expansion ratio of about 33%.

The net result of the compression and expansion is approximately a 2.5 to 1 compression from the original XML document. At 130, at least one XML tag is associated with the compressed valid XML document in order to identify the document as a compressed XML document. An example of an embodiment using an XML tag at the beginning and end of the file is shown in FIG. 6.

In a specific example, the XML document is a configuration file used to configure a remote device. A description of using XML documents to configure remote devices is included in co-pending U.S. patent application Ser. No. 10/873,051, entitled "DEVICE SERVER ACCESS USING A DATA TYPE AWARE MARK-UP LANGUAGE," which is incorporated herein by reference. An example original XML document configuration file is shown in FIG. 7. The compressed version of the document of FIG. 7 is shown in FIG. 8.

The compressed document looks random because of compression and expansion with encoding. However, the compressed document is a valid XML document.

Note that due to space limitations, the original XML document is small, about 440 bytes. This results in the compressed document in the example being larger than the original XML document. Because of the way compression algorithms work, the algorithms only compress well when the original file is large, e.g., greater than 4000 bytes. For smaller documents, the amount of memory used or the amount of time spent in sending the document is not an issue and the method to manage the XML documents may not be needed.

Because the compressed document is valid XML, any application that can read XML documents will recognize the document and can access its contents. To use the document, the application must decompress the document to return the document to its original format. This involves reversing the compression and encoding process. Therefore, a further embodiment of the method 100 for managing XML documents includes reconverting the compressed valid XML document into a binary stream, and decompressing the binary stream to obtain the first XML document. In one embodiment, reconverting into binary includes reverse base-64 encoding, and decompressing includes running a reverse deflate algorithm on the interim binary stream. If a mechanism other than base-64 encoding is used, the replaced characters must be reconverted from their XML replacements.

Figure 2:
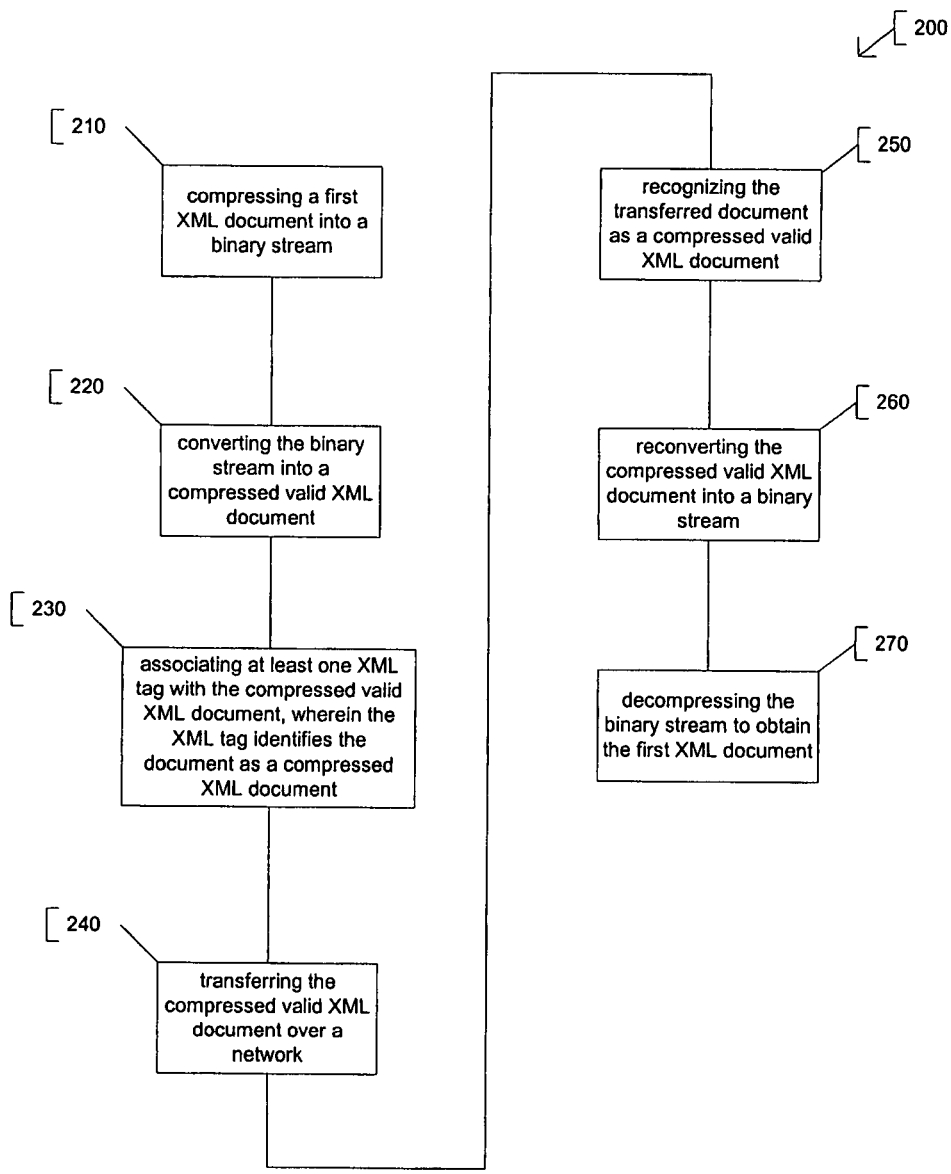
FIG. 2 shows a block diagram of another embodiment of a method of managing XML documents.

FIG. 2 shows a block diagram of an embodiment of a method 200 that includes compressing and encoding a first XML document and then transferring a compressed valid XML document over a network. The first XML document is any generic document, such as a status message for example. At 210 a first XML document is compressed into a binary stream. At 220, the binary stream is converted into a compressed valid XML document. The compressing and encoding are accomplished by any of the methods discussed previously. At 230, at least one XML tag is associated with the compressed valid XML document that identifies the document as a compressed XML document. At 240, the compressed valid XML document is transferred over a network to a receiving device. At 250, the transferred document is recognized as a compressed valid XML document. According to some embodiments, a master device such as a master processor generates the compressed valid XML document and initiates the transfer to a remote device that recognizes the XML document from the at least one XML identifying tag. In an example of one such embodiment, the first XML document includes a configuration file. In another example, the first XML document includes a status message. In yet another example, the first XML document includes a command message. According to other embodiments, a remote device generates the compressed valid XML document and initiates the transfer. At 260, the compressed valid XML document is reconverted into a binary stream. At 270, the binary stream is decompressed to obtain the first XML document. A receiving device is then able to process the XML document.

In yet another embodiment, transferring the compressed valid XML document over a network includes transferring the compressed valid XML document over a serial communications network, such as a network that uses an RS232 protocol or an Ethernet network. In yet another embodiment, transferring the compressed XML document over a network includes transferring the compressed valid XML document over a wireless network, such as a wireless local area network (WLAN) or a mobile phone network. In a further embodiment, transferring the compressed XML document over a network includes transferring the compressed valid XML document over the internet. In other embodiments, one or a combination of the several method embodiments are provided on a computer readable medium such as a diskette or CD ROM.

Figure 3:
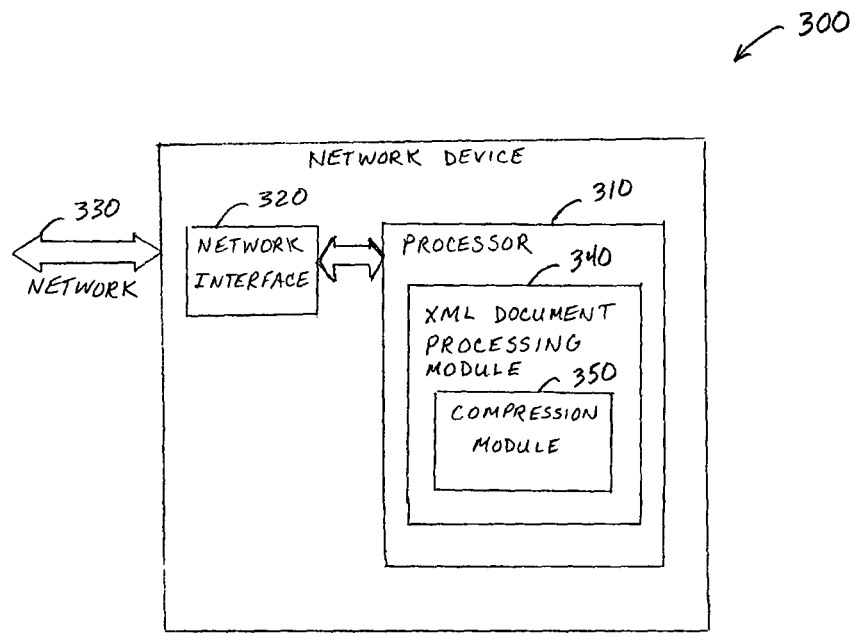
FIG. 3 is block diagram illustrating portions of a network device operable to manage XML documents.

FIG. 3 is block diagram illustrating portions of a network device 300 operable to manage XML documents. The network device 300 includes at least one processor 310, a network interface 320 to communicate with the at least one processor 310 and a network 330, and an XML document processing module 340.

The XML document processing module 340 includes a compression module 350 to generate compressed valid XML documents. In one embodiment, the XML document processing module 350 includes a deflate compression algorithm. In another embodiment, the XML document processing module 350 includes a binary to ASCII text encoding algorithm. In one such embodiment, the binary to ASCII text encoding algorithm includes a base-64 encoding algorithm.

In some embodiments, the network device 300 is an embedded device server operable to manage a remote device using XML documents. In another embodiment, the network interface 320 includes a serial port. In another embodiment, the network interface 320 includes a web interface. In another embodiment, the network 330 is a wireless network. In one such embodiment, the network device 300 is included in a cell phone. In another embodiment, the network 330 is a wireless local area network (WLAN) and the network device 300 is included in a WLAN computer card.

Figure 4:
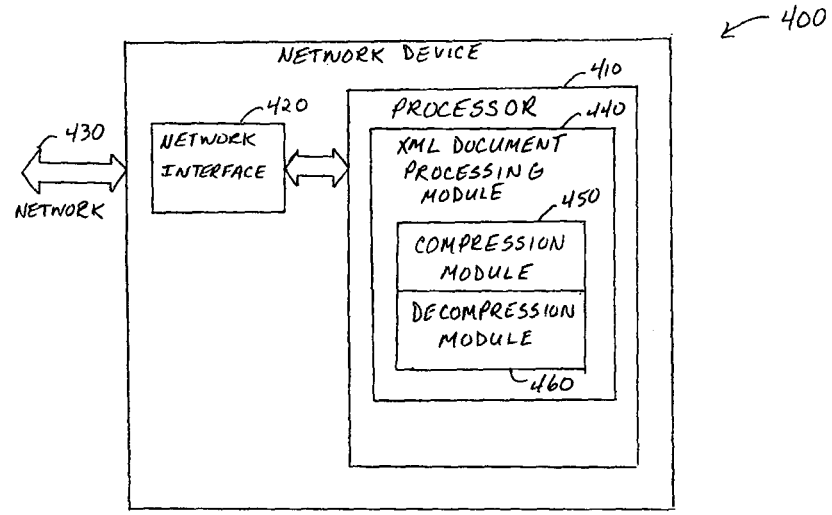
FIG. 4 is block diagram illustrating portions of another embodiment of a network device operable to manage XML documents.

FIG. 4 is a block diagram of portions of an embodiment of a network device 400 operable to recognize a compressed valid XML document and reverse the compression process. The network device 400 includes at least one processor 410, a network interface 420 to communicate with the at least one processor 410 and a network 430, and an XML document processing module 440 that includes a compression module 450. To reverse the compression process, the network device 400 includes a decompression module to 460 decompress compressed valid XML documents. In one embodiment, the decompression module 460 includes a re-conversion algorithm to reconvert a compressed valid XML document into a binary stream and a reverse deflate algorithm to convert the interim binary stream into an XML document.

Figure 5:
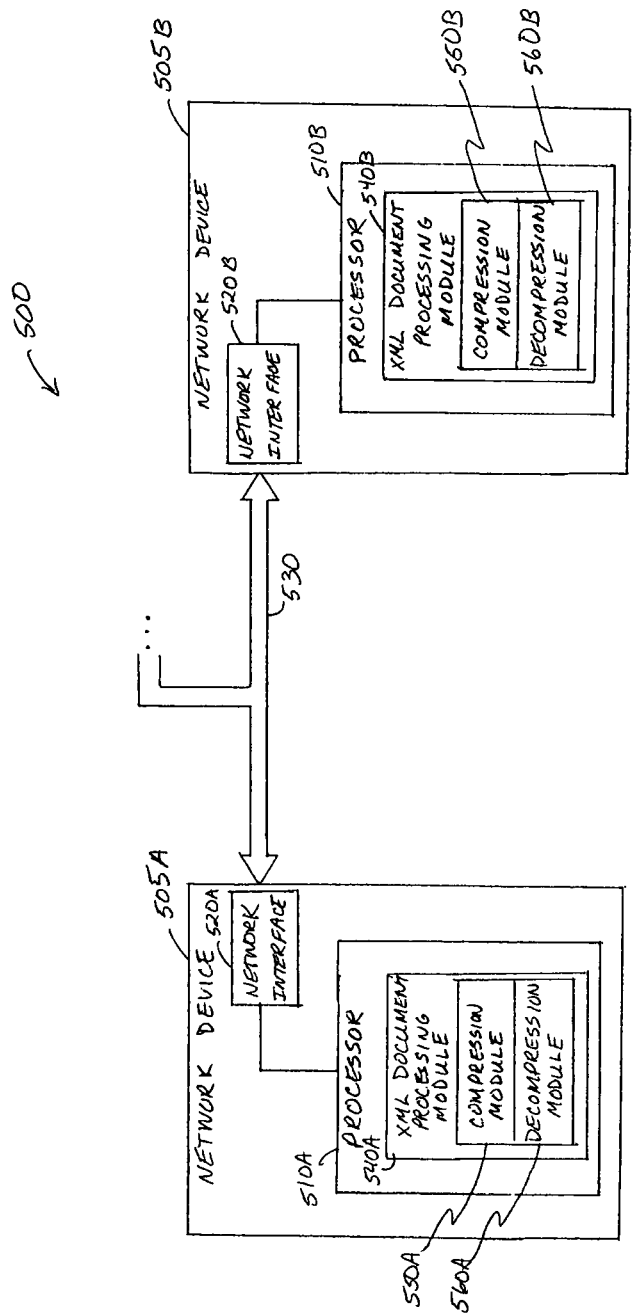
FIG. 5 is a block diagram of portions of an embodiment of a system for managing XML documents.

FIG. 5 is a block diagram of portions of an embodiment of a system 500 for communicating XML documents. The system 500 includes a communication network 530 and at least first and second network devices 505A-B to communicate over the network 530. Each network device 505A-B includes at least one processor 510A-B, a network interface 520A-B to communicate with the at least one processor 510A-B and the network 530, and an XML document processing module 540A-B. An XML document processing module 540A-B includes a compression module 550A-B to compress XML documents into compressed valid XML documents and a decompression module 560B to decompress compressed valid XML documents.

In one embodiment, a first network device 505A is operable to transfer a status message over the network 530 as a compressed valid XML document to a second network device 505B. In another embodiment, a first network device 505A is an embedded device server operable to receive a device configuration file as a compressed valid XML document over the network 530 and decompress the document. According to other embodiments, the network 530 is a serial communication network. In other embodiments, the network 530 is a wireless communication network.

The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

The invention claimed is:

1. A method of compressing XML documents, the method comprising:
    compressing a first XML document into a binary stream;
    converting the compressed binary stream into compressed text encoded from the compressed binary stream;
    formatting the compressed text so as to form a compressed valid XML document; and
    associating at least one XML tag with the compressed valid XML document, wherein the XML tag identifies the document as a compressed XML document.

2. The method of claim 1, wherein compressing the first XML document into a binary stream includes compressing the XML document using a deflate compression algorithm.

3. The method of claim 1, wherein converting the binary stream into the compressed valid XML document includes converting the binary stream to ASCII text using base-64 encoding.

4. The method of claim 1, wherein converting the binary stream into the compressed valid XML document includes replacing invalid XML characters with standard XML replacement text.

5. The method of claim 1, wherein the first XML document includes a configuration file to configure a remote device.

6. A method of transferring XML documents, the method further comprising:
    compressing a first XML document into a compressed binary stream;
    converting the compressed binary stream into compressed text encoded from the compressed binary stream;
    formatting the compressed text so as to form a compressed valid XML document;
    associating at least one XML tag with the compressed valid XML document, wherein the XML tag identifies the compressed valid XML document as a compressed XML document;
    transferring the compressed valid XML document over a network;
    reconverting the compressed valid XML document into the compressed binary stream; and
    decompressing the binary stream to obtain the first XML document.

7. The method of claim 6, wherein reconverting the compressed valid XML document into a binary stream includes reconverting standard XML replacement text back to original characters.

8. The method of claim 6, wherein transferring the compressed valid XML document over a network includes transferring the compressed valid XML document over a serial communications network.

9. The method of claim 6, wherein transferring the compressed XML document over a network includes transferring the compressed valid XML document over a wireless network.

10. The method of claim 6, wherein transferring the compressed XML document over a network includes transferring the compressed valid XML document over the internet.

11. A non-transitory computer readable medium to implement a method of compressing XML documents, the non-transitory computer readable medium comprising program code for:
    compressing an XML document into a compressed binary stream;

converting the compressed binary stream into compressed text encoded from the compressed binary stream;

formatting the compressed text so as to form a compressed valid XML document; and associating at least one XML tag with the compressed valid XML document, wherein the XML tag identifies the compressed valid XML document as a compressed XML document.

12. The non-transitory computer readable medium of claim 11, wherein the non-transitory computer readable medium further includes program code for:

reconverting the compressed valid XML document into a binary stream; and decompressing the binary stream into an XML document.

13. The non-transitory computer readable medium of claim 11, wherein the program code includes a deflate compression algorithm.

14. The non-transitory computer readable medium of claim 11, wherein the program code includes a binary to ASCII text encoding algorithm.

15. A method for transmitting XML documents, the method comprising:

compressing a first XML document into a compressed binary stream;

converting the compressed binary stream into compressed text encoded from the compressed binary stream;

formatting the compressed text so as to form a compressed valid XML document;

associating at least one XML tag with the compressed valid XML document, wherein the XML tag identifies the document as a compressed XML document;

transferring the compressed valid XML document over a network;

recognizing the transferred document as a compressed valid XML document;

reconverting the compressed valid XML document into the compressed binary stream; and decompressing the binary stream to obtain the first XML document.

16. The method of claim 15, wherein reconverting the compressed valid XML document into a binary stream includes reverse base-64 encoding.

17. The method of claim 16, wherein decompressing the binary stream includes running a reverse deflate algorithm.

18. The method of claim 17, wherein transferring over a network includes transferring over the internet.

\* \* \* \* \*